US012310153B2

(12) United States Patent
Liu et al.

(10) Patent No.: US 12,310,153 B2
(45) Date of Patent: May 20, 2025

(54) MINI LIGHT-EMITTING DIODE CHIP HAVING AN EXTENDED ELECTRODE FACING AWAY FROM A GROWTH SUBSTRATE AND MANUFACTURING METHOD THEREOF

(71) Applicant: XIAMEN CHANGELIGHT CO., LTD., Xiamen (CN)

(72) Inventors: Yingce Liu, Xiamen (CN); Junxian Li, Xiamen (CN); Zhao Liu, Xiamen (CN); Xuan Huang, Xiamen (CN); Xingen Wu, Xiamen (CN)

(73) Assignee: XIAMEN CHANGELIGHT CO., LTD., Xiamen (CN)

( * ) Notice: Subject to any disclaimer, the term of this patent is extended or adjusted under 35 U.S.C. 154(b) by 469 days.

(21) Appl. No.: 17/832,558

(22) Filed: Jun. 3, 2022

(65) Prior Publication Data
US 2022/0302352 A1    Sep. 22, 2022

Related U.S. Application Data

(63) Continuation of application No. PCT/CN2020/138989, filed on Dec. 24, 2020.

(30) Foreign Application Priority Data

Dec. 26, 2019    (CN) .......................... 201911366387.1
Dec. 26, 2019    (CN) .......................... 201922386858.7

(51) Int. Cl.
*H10H 20/81*    (2025.01)
*H10H 20/01*    (2025.01)
(Continued)

(52) U.S. Cl.
CPC ........ *H10H 20/8312* (2025.01); *H10H 20/01* (2025.01); *H10H 20/814* (2025.01); *H10H 20/82* (2025.01); *H10H 20/032* (2025.01)

(58) Field of Classification Search
CPC ..... H01L 33/382; H01L 33/005; H01L 33/10; H01L 33/22
(Continued)

(56) References Cited

U.S. PATENT DOCUMENTS 10,312,414 B1    6/2019    Chen et al.
2017/0012175 A1*   1/2017    Wang .................... H01L 27/156

FOREIGN PATENT DOCUMENTS

CN    107546303 A    1/2018
CN    208142208 U    11/2018
(Continued)

OTHER PUBLICATIONS

International Search Report of International Application No. PCT/CN2020/138989 dated Mar. 22, 2021 with English translation, (4p).

*Primary Examiner* — Phuc T Dang
(74) *Attorney, Agent, or Firm* — Arch & Lake LLP; Hao Tan; Shen Wang

(57) ABSTRACT

A mini LED chip and a manufacturing method thereof are provided. The mini LED chip includes a growth substrate and a light-emitting epitaxial layer including a first type semiconductor layer, a luminous layer, and a second type semiconductor layer. The second type semiconductor layer and the luminous layer include an electrode contact hollow part that exposes the first type semiconductor layer. Further, the mini LED chip includes a transparent conductive layer disposed on a side of the second type semiconductor layer facing away from the growth substrate, an extended electrode disposed on a side of the transparent conductive layer facing away from the growth substrate, an insulating and isolating reflection layer covering the electrode contact hollow part and an exposed surface of the transparent
(Continued)

conductive layer and the extended electrode facing away from the growth substrate, and a first bonding electrode and a second bonding electrode.

20 Claims, 8 Drawing Sheets

(51) Int. Cl.
  *H10H 20/814* (2025.01)
  *H10H 20/82* (2025.01)
  *H10H 20/831* (2025.01)
(58) Field of Classification Search
  USPC .......................................................... 257/79
  See application file for complete search history.

(56) References Cited

FOREIGN PATENT DOCUMENTS

| | | | | |
|---|---|---|---|---|
| CN | 108987557 | A | 12/2018 | |
| CN | 109545935 | A | 3/2019 | |
| CN | 110931620 | A | 3/2020 | |
| CN | 211265505 | U | 8/2020 | |
| EP | 0897215 | A2 * | 2/1999 | ............. H01L 24/45 |

* cited by examiner

MINI LIGHT-EMITTING DIODE CHIP HAVING AN EXTENDED ELECTRODE FACING AWAY FROM A GROWTH SUBSTRATE AND MANUFACTURING METHOD THEREOF

CROSS-REFERENCE TO RELATED APPLICATIONS

This application is a continuation of International Application No. PCT/CN2020/138989, filed on Dec. 24, 2020, which claims priorities to Chinese Patent Application No. 201911366387.1, filed on Dec. 26, 2019, and, Chinese Patent Application No. 201922386858.7, filed on Dec. 26, 2019, the entire disclosures of which are incorporated herein by reference for all purposes.

TECHNICAL FIELD

The present disclosure generally relates to the field of semiconductor device, and more particularly, to a mini light-emitting diode (LED) chip and manufacturing method thereof.

BACKGROUND

Liquid Crystal Display (LCD) has the advantages of light, flimsy, easy to drive and no harmful rays etc. It is widely used in modern information equipment such as televisions, laptops and mobile phones. However, since the LCD itself is nonluminous, the display needs to be realized by coupling an external light source, correspondingly resulting in a thicker display device of LCD. In order to adapt to the trend of light and flimsy display panels, organic light-emitting diode (OLED) display panels emerged after LCD, which have excellent properties such as self-luminous, no backlight, high-contrast, thickness reduction, fast response speed, available for flexible panels and so on.

With the updating of display panels, a new type of display panel named a mini LED display panel, is also an active light-emitting device with a faster response speed, wider operating temperature range, higher luminous efficiency, longer life and lower cost when compared with an OLED display panel. These advantages make mini LED display panel expected to become the mainstream display panel in the future. Moreover, the RGB mini LED chip overcomes the defects of soldering and reliability of a normal chip, along with the packaging advantages of COB (Chips on Board) to further reduce the pitch of the display screen. Hence, the visual effect of the terminal product is greatly improved. In the meanwhile, the sight distance can be greatly reduced as well. So that the indoor display can further replace the original LCD at the market. On the other hand, the use of RGB mini LED chips along with flexible substrates can also achieve high-quality display effects on curved surfaces. Furthermore, it has a wide broad market for some special modeling needs (such as cars display), especially coupled with its self-illumination properties.

SUMMARY

The present disclosure provides a mini LED chip and a manufacturing method thereof.

According to a first aspect of the present disclosure, a mini LED chip is provided. The mini LED chip includes: a growth substrate and a light-emitting epitaxial layer sequentially stacked, where the light-emitting epitaxial layer includes a first type semiconductor layer, a luminous layer, and a second type semiconductor layer which are sequentially stacked, where the second type semiconductor layer and the luminous layer include an electrode contact hollow part that exposes the first type semiconductor layer.

Furthermore, the mini LED chip includes a transparent conductive layer disposed on a side of the second type semiconductor layer facing away from the growth substrate, where the transparent conductive layer includes a hollow part corresponding to the electrode contact hollow part.

Moreover, the mini LED chip includes an extended electrode disposed on a side of the transparent conductive layer facing away from the growth substrate and an insulating and isolating reflection layer configured to cover the electrode contact hollow part and an exposed surface of the transparent conductive layer and the extended electrode facing away from the growth substrate, where the insulating and isolating reflection layer includes a first through hole exposing the first type semiconductor layer corresponding to the electrode contact hollow part and a second through hole exposing the extended electrode corresponding to the extended electrode.

Further, the mini LED chip includes a first bonding electrode and a second bonding electrode disposed on a side of the insulating and isolating reflection layer facing away from the growth substrate, where the first bonding electrode contacts the first type semiconductor layer via the first through hole and the second bonding electrode contacts the extended electrode via the second through hole.

According to a second aspect of the present disclosure, a method for manufacturing a mini LED chip is provided. The method includes: providing a growth substrate; growing a light-emitting epitaxial layer on the growth substrate, where the light-emitting epitaxial layer includes a first type semiconductor layer, a luminous layer and a second type semiconductor layer which are sequentially stacked, where the second type semiconductor layer and the luminous layer includes an electrode contact hollow part that exposes the first type semiconductor layer; forming a transparent conductive layer on a side of the second type semiconductor layer facing away from the growth substrate, where the transparent conductive layer includes a hollow part corresponding to the electrode contact hollow part; and forming an extended electrode on a side of the transparent conductive layer which is facing away from the growth substrate.

Furthermore, the method includes: forming an insulating and isolating reflection layer configured to cover the electrode contact hollow part and an exposed surface of the transparent conductive layer and the extended electrode facing away from the growth substrate, where the insulating and isolating reflection layer includes a first through hole exposing the first type semiconductor layer corresponding to the electrode contact hollow part and a second through hole exposing the extended electrode corresponding to the extended electrode; and forming a first bonding electrode and a second bonding electrode on a side of the insulating and isolating reflection layer facing away from the growth substrate, where the first bonding electrode contacts the first type semiconductor layer via the first through hole and the second bonding electrode contacts the extended electrode via the second through hole.

DETAILED DESCRIPTION

Figure 1:
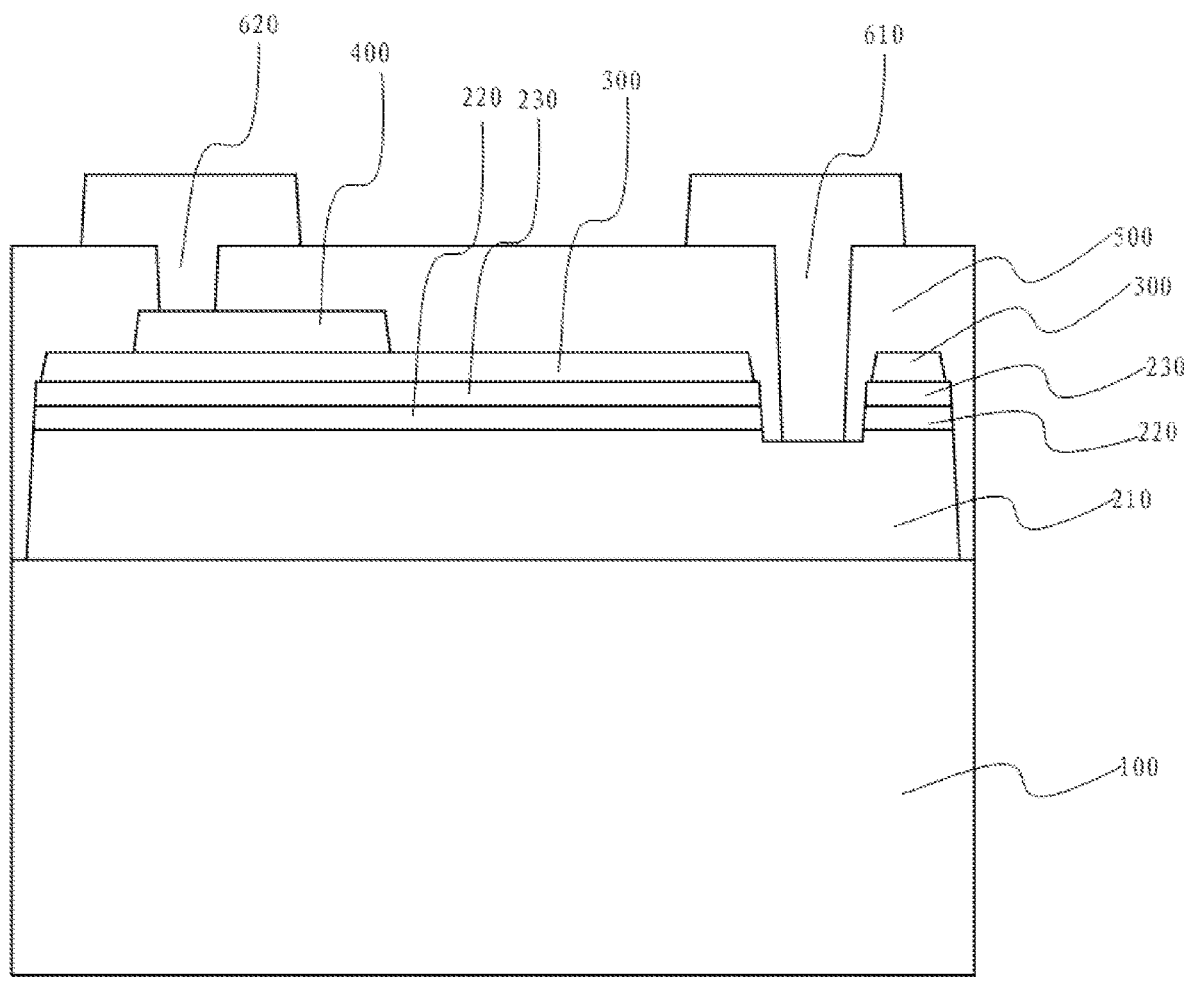
FIG. 1 is a schematic diagram showing a mini LED chip according to an example of the present disclosure.

Reference will now be made in detail to exemplary examples, examples of which are illustrated in the accompanying drawings. The implementations set forth in the following description of exemplary examples do not represent all implementations consistent with the disclosure. Instead, they are merely examples of devices and methods consistent with aspects related to the disclosure as recited in the appended claims. Based on the examples of the present disclosure, all other examples obtained by those of ordinary skill in the art without creative efforts shall fall within the protection scope of the present disclosure.

As described in the background, with the updating of display panels, a new type of display panel named the mini LED display panel is emerging on the market. It also belongs to an active light-emitting device with a faster response speed, wider operating temperature range, higher light source utilization, longer life and lower cost when compared with an OLED display panel. These advantages make the mini LED display panel expected to become the mainstream display panel in the future. Moreover, the RGB mini LED chip overcomes the defects of soldering and reliability of a normal chip, along with the packaging advantages of COB (Chips on Board) to further reduce the pitch of the display screen. Hence the visual effect of the terminal product is greatly improved. In the meanwhile, the sight distance can be greatly reduced. So that the indoor display can further replace the original LCD at the market. On the other hand, the use of RGB mini LED chips along with flexible substrates can also achieve high-quality display effects on curved surfaces. Furthermore, it has a wide broad market for some special modeling needs (such as cars display), especially coupled with its self-illumination properties.

The existing mini LED chip epitaxial structure generally includes an N-type layer, a luminous layer and a P-type layer, and a table board exposing the N-type layer is etched in the P-type layer and the luminous layer. The existing mini LED chip further includes a P-type extended electrode disposed on the P-type layer, an N-type extended electrode disposed on the N-type layer at the table board, a reflective layer covering the exposed surface of the mini LED chip at the extended electrode, a P bonding electrode disposed on the reflective layer and connected with the P-type extended electrode via a through hole, and an N bonding electrode disposed on the reflection layer and connected with the N-type extended electrode via a through hole. In the existing mini LED chip, because of the existence of the N-type extended electrode, the table board areas of the P-type layer and the exposed N-type layer at the luminous layer need to be increased, and finally the luminous area is reduced, so that the luminous efficacy is low. Because the N-type extended electrode is manufactured and formed in an evaporation mode, its side surface is steeper, which affects the covering effect of the reflecting layer, and then the reliability of the mini LED chip is reduced. In the meanwhile, due to the existence of the N-type extended electrode, the surface of the finally manufactured N bonding electrode is uneven, and then the bonding effect is affected. Hence the reliability and the luminous angle of the mini LED chip are affected correspondingly.

Based on the above, the disclosure provides a mini LED chip and a manufacturing method thereof, which effectively solve the technical problems existing in the prior art, improve the luminous efficiency and reliability of the mini LED chip, and simultaneously ensure that the luminous angle of the mini LED chip achieves the expected effect.

In order to achieve the above objects, the technical solutions provided by the present disclosure are described in detail below, specifically with reference to FIG. 1 to FIG. 5f.

Referring to FIG. 1, a schematic diagram of a mini LED chip according to an example of the present disclosure is shown, and the mini LED chip includes:

a growth substrate 100 and a light-emitting epitaxial layer sequentially stacked, the light-emitting epitaxial layer includes a first type semiconductor layer 210, a luminous layer 220 and a second type semiconductor layer 230 which are sequentially stacked, where the second type semiconductor layer 230 and the luminous layer 220 are provided with an electrode contact hollow part that exposes the first type semiconductor layer 210;

a transparent conductive layer 300, disposed on a side of the second type semiconductor layer 230 that faces away from the growth substrate 100, and the transparent conductive layer 300 includes a hollow part corresponding to the electrode contact hollow part;

the extended electrode 400, disposed on a side of the transparent conductive layer 300, where the side of the transparent conductive layer faces away from the growth substrate 100;

an insulating and isolating reflection layer 500, configured to cover the electrode contact hollow part and the exposed surface of the transparent conductive layer 300 and the extended electrode 400 facing away from the growth substrate 100, where the insulating and isolating reflection layer 500 includes a first through hole exposing the first type semiconductor layer 210 corresponding to the electrode contact hollow part and a second through hole exposing the extended electrode 400 corresponding to the extended electrode 400; and a first bonding electrode 610 and a second bonding electrode 620, disposed on a side of the insulating and isolating reflection layer 500 that faces away from the growth substrate 100, where the first bonding electrode 610 contacts the first type semiconductor layer 210 via the first through hole, and the second bonding electrode 620 contacts the extended electrode 400 via the second through hole.

In an example of the disclosure, the first type semiconductor layer provided in the disclosure is an N-type semiconductor layer, and the second type semiconductor layer is a P-type semiconductor layer, which is not limited in the disclosure.

It can be understood that, according to the technical solutions provided by the disclosure, the first type semiconductor layer and the first bonding electrode are not connected through the corresponding auxiliary extended electrode, that is, no auxiliary extended electrode is formed on the exposed surface of the first type semiconductor layer at the electrode contact hollow part. So that the problem that the auxiliary extended electrode shields the luminous area is avoided, and the luminous efficacy of the mini LED chip is improved. Furthermore, there is no need to manufacture the auxiliary extended electrode in present disclosure, so that the problems of poor flatness of the first bonding electrode and poor coverage effect of the insulating and isolating reflection layer are solved due to the existence of the auxiliary extended electrode, the reliability of the mini LED chip is improved, and meanwhile, the luminous angle of the mini LED chip is ensured to achieve the expected effect.

Figure 2:
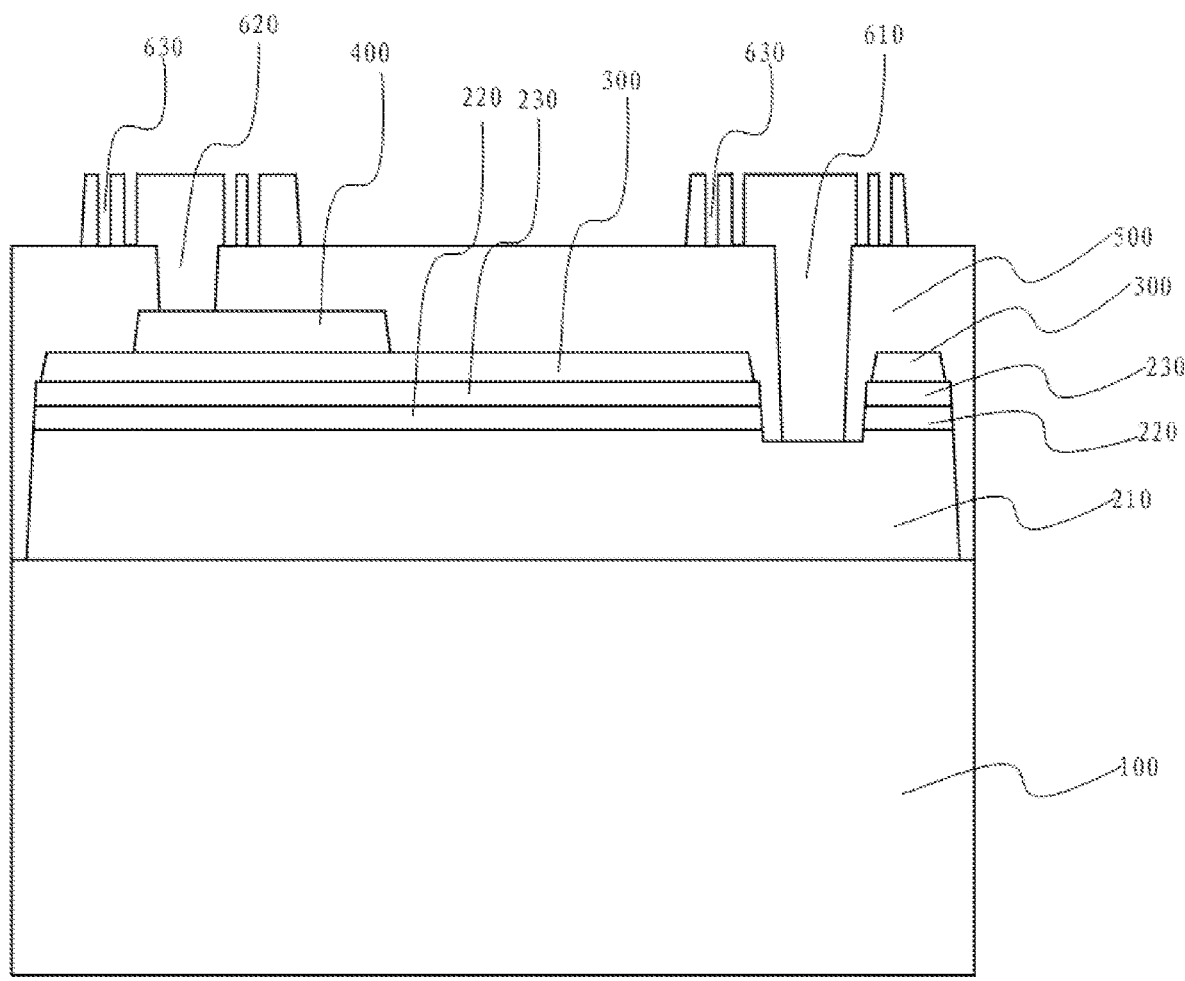
FIG. 2 is a schematic diagram showing a mini LED chip according to another example of the present disclosure.

Because the mini LED chip is finally required to be die-bonded onto the wiring substrate, at least one of the first bonding electrode and the second bonding electrode has a plurality of holes in the disclosure in order to improve the die-bonding effect and avoid die-bonding deflection. Referring to FIG. 2, a schematic diagram of a mini LED chip according to another example of the present disclosure is shown, where at least one of the first bonding electrode 610 and the second bonding electrode 620 has a plurality of holes 630 in the present disclosure.

It can be understood that, in the technical solutions provided by the disclosure, preferably, when the first bonding electrode and the second bonding electrode are manufactured, a plurality of holes are processed on both of them. Furthermore, the first bonding electrode and the second bonding electrode are manufactured into a bonding electrode structure with a plurality of holes, so that the contact area between the bonding electrodes and solder (such as tin paste) can be increased, and the phenomenon of die-bonding deflection caused by the back suction of the tin paste is avoided.

Figure 3:
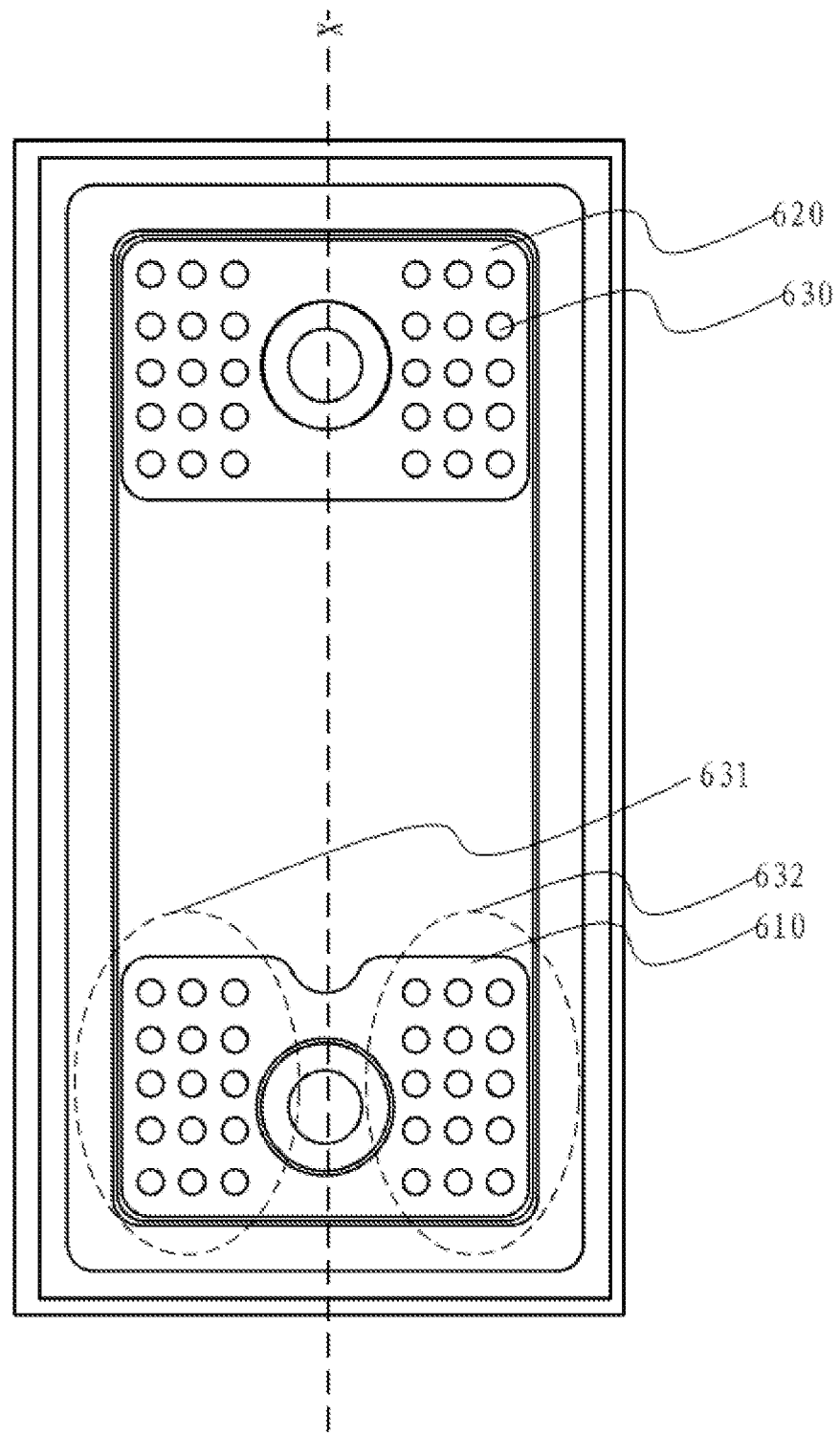
FIG. 3 is a schematic diagram showing a mini LED chip according to another example of the present disclosure.

Furthermore, in the example of the disclosure, a plurality of holes on the bonding electrode can be optimized, thereby further to improve the die-bonding effect. Referring to FIG. 3, a schematic diagram of a mini LED chip according to another example of the present disclosure is shown, where the bonding electrode has a plurality of holes 630, and the plurality of holes 630 are divided into a first group of holes 631 and a second group of holes 632.

The first group of holes 631 and the second group of holes 632 are symmetrical about a symmetry axis X which is a connection line from the first through hole to the second through hole, and the die-bonding effect is further improved by optimizing the layout of the holes.

In any example of the present disclosure, holes provided in the present disclosure are in a through hole shape or a blind hole shape, that is, holes may be through hole shaped which is penetrating through the bonding electrode, or blind hole shaped which is not penetrating through the bonding electrode from the surface of the bonding electrode and facing away from the insulating and isolating reflection layer. The present disclosure is not specifically limited to this. In order to further increase the contact area between the bonding electrode and the solder (such as solder paste), the aperture tends to increase in the direction from the growth substrate to the light-emitting epitaxial layer. The aperture size provided by the disclosure can be 1 μm-10 μm, including endpoint values; the aperture size can be optimized to be 3 μm-8 μm, including endpoint values; and the aperture size may be further optimized to 4 μm-5 μm, including endpoint values, and the present disclosure is not specifically limited to this too.

In some examples of the disclosure, the side wall of the hole is roughened, so that the die-bonding effect of the hole is further improved. In some examples, the side wall of the hole is roughened so that the die-bonding effect of the hole is improved by at least 30%. In some examples, the roughness Ra of the side wall of the roughened surface is less than or equal to 50 μm.

As shown in FIG. 1, the insulating and isolating reflection layer 500 provided in the example of the present disclosure further extends to cover the side exposed surface of the light-emitting epitaxial layer, that is, the insulating and isolating reflection layer 500 further extends to cover the side exposed surfaces of the first type semiconductor layer 210, the luminous layer 220, the second type semiconductor layer 230 and the transparent conductive layer 300 and facing the external side, so as to ensure high side luminous efficiency and improve the overall luminous efficacy of the mini LED chip.

It can be understood that the surface of the growth substrate facing to the light-emitting epitaxial layer provided by the disclosure is divided into an isolating region that the device area surrounds the device area, where the light-emitting epitaxial layer is grown in the device area, and the isolating region is an extended cut-off boundary of the insulating and isolating reflection layer. The isolating region provided in the example of the present disclosure can be located in a cutting region of defining a single chip, or the isolating region can also be a separately fabricated region, the present disclosure is not specifically limited to this.

In an example of the disclosure, the insulating and isolating reflection layer provided in the disclosure is a distributed Bragg reflector (DBR) insulating and isolating reflection layer. Alternatively, the DBR insulating and isolating reflection layer provided by the disclosure is a DBR reflection film system layer structure formed by any combination of following material: $SiO_2$, $SiN$, $TiO_2$, $Ta_2O_5$, or $MgF$.

Referring to FIG. 1, the electrode contact hollow part provided in the example of the present disclosure may include an electrode contact hole, and the electrode contact hole is located within the coverage area of the second-type semiconductor layer 230 and the light luminous layer 220.

In some examples, the electrode contact hollow part may be an electrode contact hole with a hole structure that is etched in the second type semiconductor layer and the luminous layer, so that the insulating and isolating reflection layer is tightly bonded with the inner wall of the electrode contact hole when the insulating and isolating reflection layer is manufactured, and hence the bonding strength between the insulating and isolating reflection layer and the light-emitting epitaxial layer is improved.

In an example of the disclosure, the side wall of the first through hole, the second through hole, or the side wall of the first through hole and the second through hole provided by the disclosure is roughened, so that the bonding strength between the bonding electrode and the insulating and isolating reflection layer can be improved, and the performance of the mini LED chip is improved too. In the direction from the growth substrate to the light-emitting epitaxial layer, the aperture of the first through hole, the aperture of the second through hole, or the aperture of the first and second through hole, tend to increase, so that the contact area between the bonding electrode and the insulating and isolating reflection layer can be enlarged, and the bonding strength between the bonding electrode and the insulating and isolating reflection layer is further improved.

Correspondingly, the present disclosure further provides a manufacturing method of a mini LED chip, as shown in FIG.

4, which is a flowchart provided in an example of the present disclosure, where the manufacturing method of a mini LED chip includes:

S1, providing a growth substrate;

S2, growing a light-emitting epitaxial layer on the growth substrate, the light-emitting epitaxial layer includes a first type semiconductor layer, a luminous layer and a second type semiconductor layer which are sequentially stacked, where the second type semiconductor layer and the luminous layer are provided with or may include an electrode contact hollow part that exposes the first type semiconductor layer;

S3, forming a transparent conductive layer on a side of the second type semiconductor layer that faces away from the growth substrate, where the transparent conductive layer includes a hollow part corresponding to the electrode contact hollow part;

S4, forming an extended electrode on a side of the transparent conductive layer which is facing away from the growth substrate;

S5, forming an insulating and isolating reflection layer that is configured to cover the electrode contact hollow part and the exposed surface of the transparent conductive layer and the extended electrode facing away from the growth substrate, where the insulating and isolating reflection layer includes a first through hole exposing the first type semiconductor layer corresponding to the electrode contact hollow part and a second through hole exposing the extended electrode corresponding to the extended electrode; and S6, forming a first bonding electrode and a second bonding electrode on a side of the insulating and isolating reflection layer which is facing away from the growth substrate, where the first bonding electrode contacts the first type semiconductor layer via the first through hole, and the second bonding electrode contacts the extended electrode via the second through hole.

Figure 4:
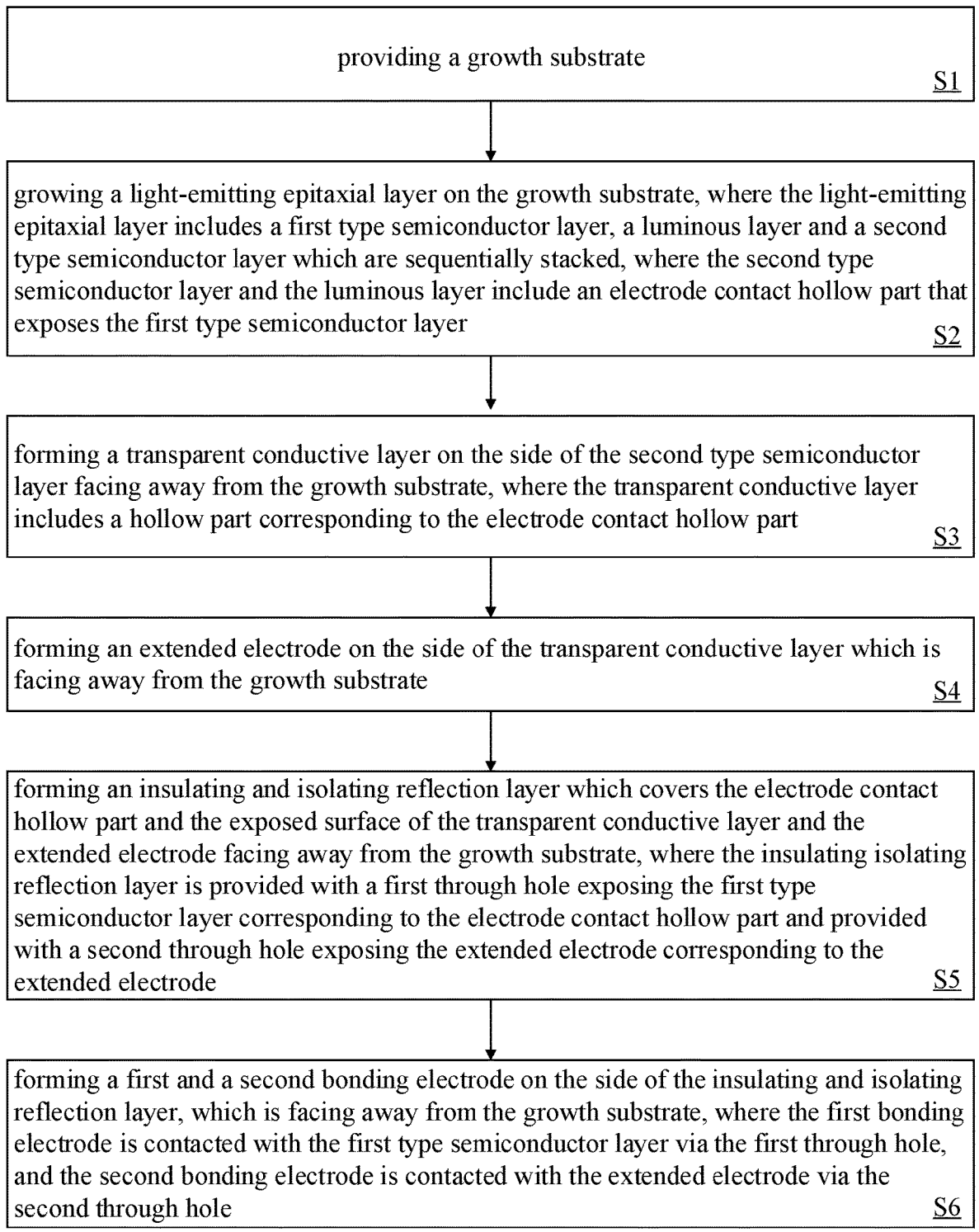
FIG. 4 is a flow chart showing a method for manufacturing a mini LED chip according to an example of the present disclosure.

The following describes the manufacturing method provided by the example of the present disclosure in detail with reference to the structures corresponding to the steps, and specifically with reference to FIG. 5A to FIG. 5F which are respectively a schematic diagram corresponding to each step in FIG. 4.

Figure 5A:
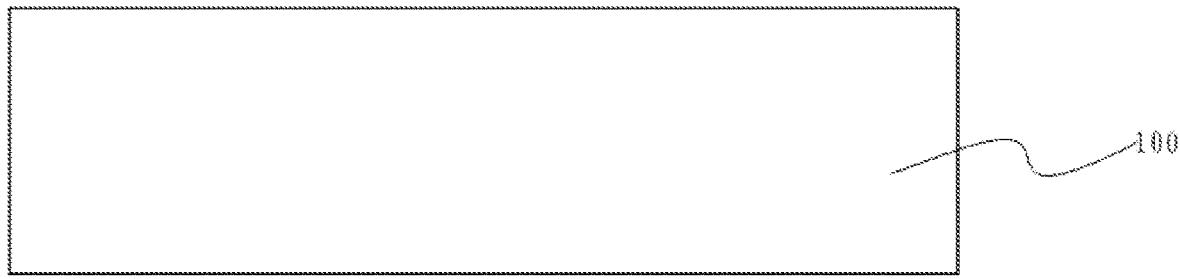
FIG. 5A is a schematic diagram corresponding to step S1 as shown in FIG. 4.

As shown in FIG. 5A, corresponding to step S1, a growth substrate 100 is provided.

In an example of the present disclosure, the material of the growth substrate provided by the present disclosure may be $Al_2O_3$, SiC, Si, GaN, GaAs, or GaP, etc., and the present disclosure is not particularly limited thereto.

Figure 5B:
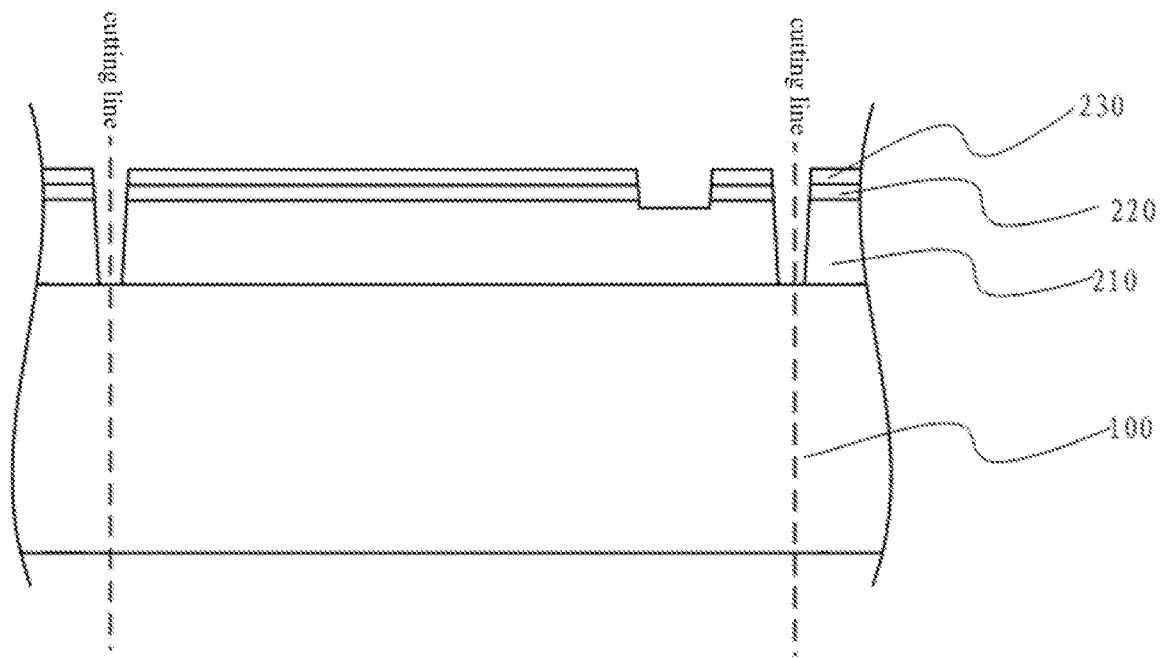
FIG. 5B is a schematic diagram corresponding to step S2 as shown in FIG. 4.

As shown in FIG. 5B, corresponding to step S2, a light-emitting epitaxial layer is grown on the growth substrate 100, and the light-emitting epitaxial layer includes a first type semiconductor layer 210, a light luminous layer 220 and a second type semiconductor layer 230, which are sequentially stacked, where the second type semiconductor layer 230 and the light luminous layer 220 are provided with electrode contact hollow part that exposes the first type semiconductor layer.

In an example of the disclosure, the electrode contact hollow part provided by the disclosure can be formed by adopting a photoetching process; that is, forming patterned photoresist on the side surface of a second type semiconductor layer and facing away from a growth substrate, then etching the exposed part of the photoresist until the first type semiconductor layer is exposed, and finally removing the photoresist.

Further, after the electrode contact hollow part is formed and before the transparent conductive layer is formed, a single chip can be defined by etching from the second type semiconductor layer along the cutting line, where the etching from the second type semiconductor layer until the growth substrate is exposed and etching the cutting region (as shown in FIG. 5b) is completed. And the single chip can also be formed by adopting a photoetching process.

Figure 5C:
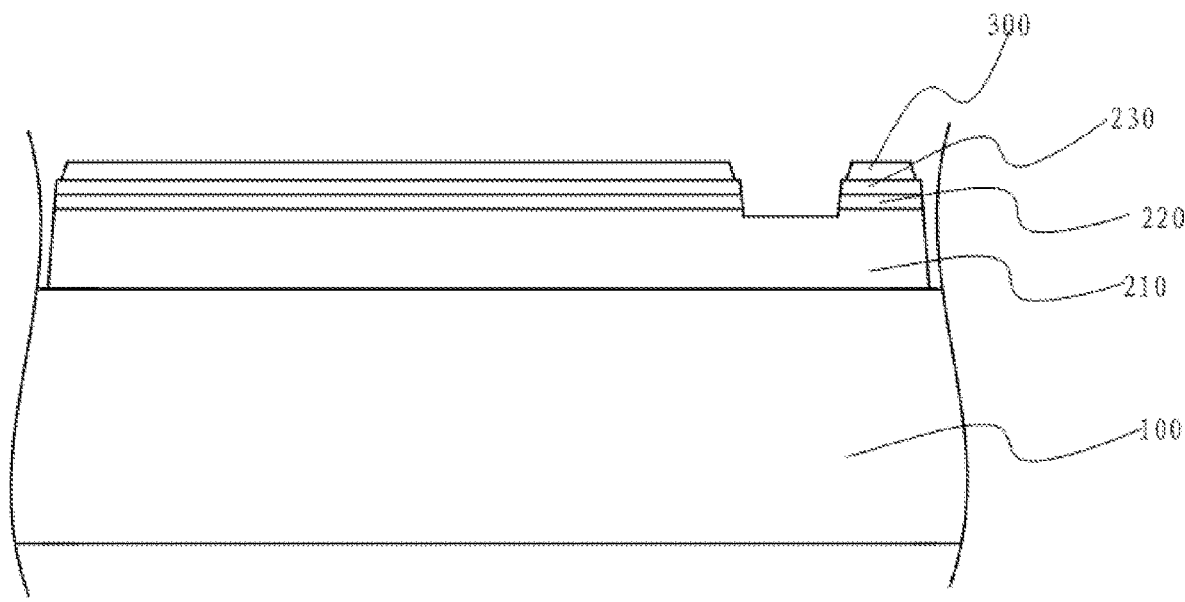
FIG. 5C is a schematic diagram corresponding to step S3 as shown in FIG. 4.

As shown in FIG. 5C, corresponding to step S3, a transparent conductive layer 300 is formed on a side of the second type semiconductor layer 230, where the side is facing away from the growth substrate 100, and the transparent conductive layer 300 includes a hollow part corresponding to the electrode contact hollow part.

In an example of the present disclosure, the material of the transparent conductive layer provided by the present disclosure may be ITO, ZnO, GaO, or other transparent conductive materials, and the thickness is in a range thereof from 200 Å-2000 Å, including endpoint values; and preferably the thickness is in a range from 300 Å-1000 Å, including endpoint values; and further the thickness is in a range from 450 Å-700 Å, including endpoint values.

Similarly, the hollow part of the transparent conducting layer provided by the disclosure corresponding to the electrode contact hollow part can be made by adopting a photoetching process.

Figure 5D:
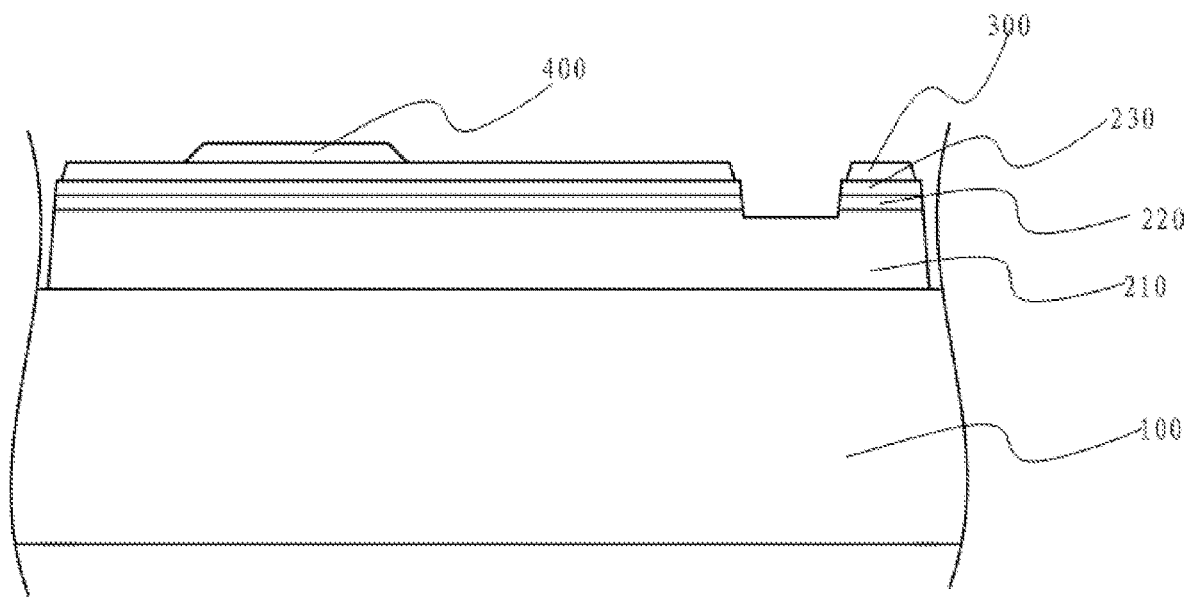
FIG. 5D is a schematic diagram corresponding to step S4 as shown in FIG. 4.

As shown in FIG. 5D, corresponding to step S4, an extended electrode 400 is formed on a side of the transparent conductive layer 300, where the side of the transparent conductive layer 300 is facing away from the growth substrate 100.

In an example of the present disclosure, the extended electrode provided by the present disclosure is made of a metal or an alloy, so that the extended electrode has a good electrical conductivity. Specifically, the material of the extended electrode may be one or a combination of Au, Al, Cu, Pt, Ti, and Cr, and the present disclosure is not limited thereto.

Figure 5E:
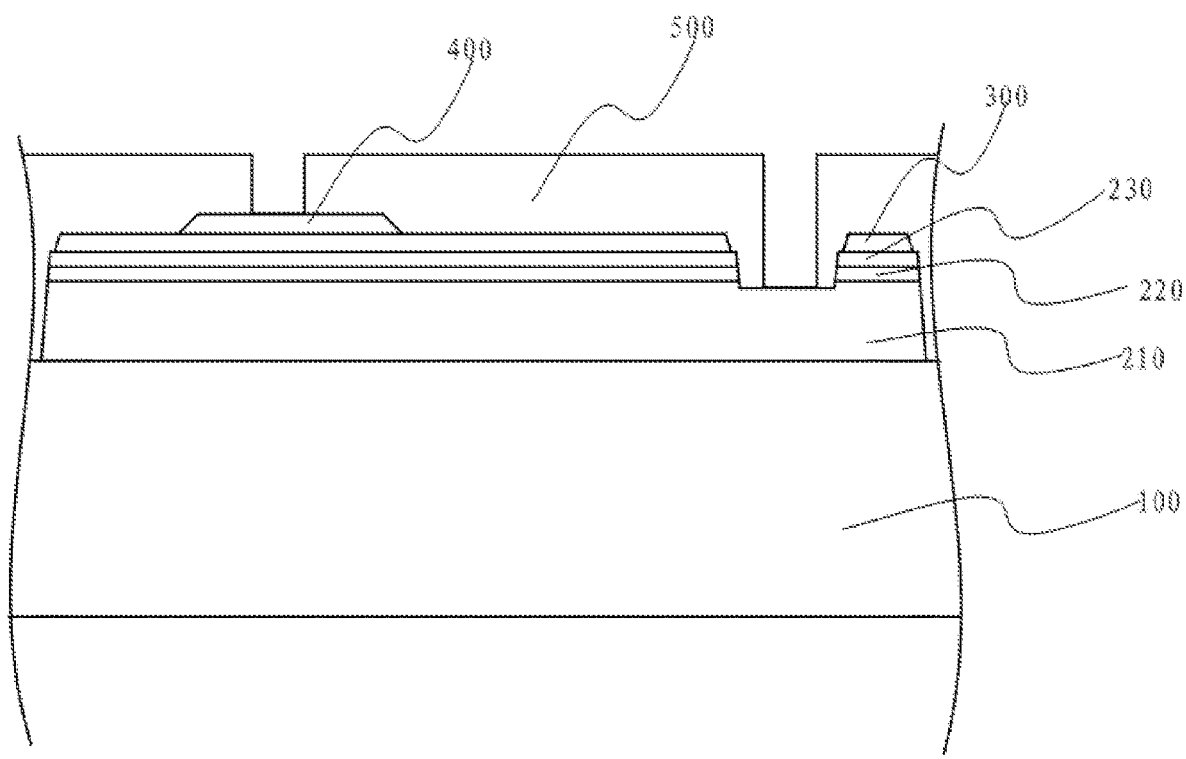
FIG. 5E is a schematic diagram corresponding to step S5 as shown in FIG. 4.

As shown in FIG. 5E, corresponding to step S5, an insulating and isolating reflection layer 500 is formed to cover the electrode contact hollow part and the exposed surface of the transparent conductive layer 300 and the extended electrode 400 that is facing away from the growth substrate 100, where the insulating and isolating reflection layer 500 includes a first through hole exposing the first type semiconductor layer 210 corresponding to the electrode contact hollow part and a second through hole exposing the extended electrode 400 corresponding to the extended electrode 400.

The insulating and isolating reflection layer 500 provided by the example of the disclosure further extends to cover the side exposed surface of the light-emitting epitaxial layer that is, the insulating and isolating reflection layer 500 further extends to cover the exposed surfaces of the side surfaces of the first type semiconductor layer 210, the light emitting layer 220, the second type semiconductor layer 230 and the transparent conductive layer 300 facing the external connection, so that the side surface luminous efficacy of the mini LED chip is ensured to be high, and the overall luminous efficacy of the mini LED chip is improved.

It can be understood that the surface of the growth substrate facing to the light-emitting epitaxial layer provided by the disclosure is divided into an isolation region that the device area surrounds the device area, where the light-emitting epitaxial layer is grown in the device region, and the isolation region is an extended cut-off boundary of the insulating and isolating reflection layer. The isolation region provided in the example of the disclosure can be located in a cutting region of defining a single chip.

In an example of the present disclosure, the insulating and isolating reflection layer provided by the present disclosure is a DBR insulating and isolating reflection layer; namely, forming an insulating and isolating reflection layer which covers the electrode contact hollow part and the exposed surface of the transparent conductive layer and the extended electrode and facing away from the growth substrate, including:

forming a DBR insulating and isolating reflection layer, configured to cover the electrode contact hollow part and the exposed surface of the transparent conductive layer and the extended electrode and facing away from the growth substrate. Alternatively, the DBR insulating isolation reflective layer provided by the disclosure is a DBR reflective film system layer structure formed by one or any combination of $SiO_2$, SiN, $TiO_2$, $Ta_2O_5$, and MgF.

Alternatively, when the insulating and isolating reflection layer provided in the example of the present disclosure is a DBR insulating and isolating reflection layer, the first through hole and the second through hole may be formed by etching the DBR insulating and isolating reflection layer in two steps. Specifically, step 1: etching the DBR insulating and isolating reflection layer, and then step 2: etching the boundary layer formed in the first etching step to obtain the first through hole and the second through hole. In the first step, the etching gas adopts a mixed gas of $CHF_3/Ar/O_2$ or $CF_4/Ar/O_2$, and in the second step, the etching gas adopts a mixed gas of $BCl_3/Cl_2/Ar$. Namely, the method of forming the first and second through holes includes: etching the insulating and isolating reflecting layer corresponding to the first through hole and the second through hole by using a first etching gas, until the first type semiconductor layer is exposed at the first through hole and the extended electrode is exposed at the second through hole, where a boundary layer is formed on the insulating and isolating reflection layer corresponding to the side walls of the first and the second through hole; etching and removing the boundary layer by using a second etching gas. The insulating and isolating reflection layer may be a DBR insulating and isolating reflection layer. Alternatively, the first etching gas provided by the disclosure includes $CHF_3$, Ar and $O_2$, or the first etching gas includes $CF_4$, Ar and $O_2$; the second etching gas includes $BCl_3$, $Cl_2$, and Ar. According to the examples of the disclosure, the ohmic contact is well improved, the voltage is reduced and the luminous efficiency is improved by manufacturing the boundary layer and then effectively removing it. In some examples, the ohmic contact is well improved, the voltage is reduced by at least 13.9%, and the luminous efficiency is improved by at least 5%.

Figure 5F:
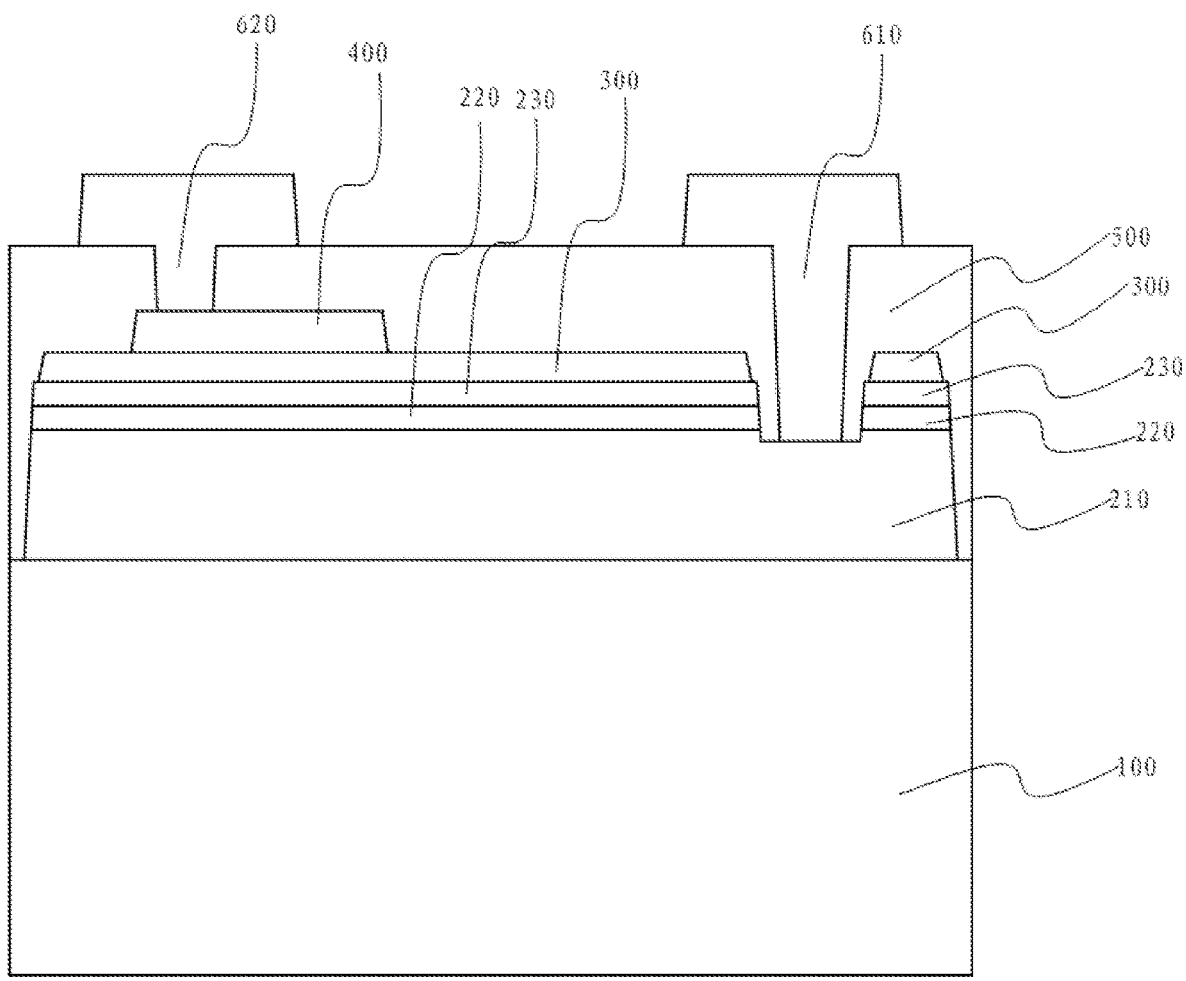
FIG. 5F is a schematic diagram corresponding to step S6 as shown in FIG. 4.

As shown in FIG. 5F, corresponding to step S6, a first bonding electrode 610 and a second bonding electrode 620 are formed on a side of the insulating and isolating reflection layer 500, where the side of the insulating and isolating refection layer is facing away from the growth substrate 100, where the first bonding electrode 610 is contacted with the first type semiconductor layer 210 via the first through hole, and the second bonding electrode 620 is contacted with the extension electrode 400 via the second through hole.

In an example of the disclosure, the material of at least one of the first bonding electrode and the second bonding electrode provided by the disclosure includes a metal or an alloy, so that the electrical conductivity is good, and the material may be one or a combination of Au, Al, Cu, Pt, Ti, and Cr, which is not limited in this disclosure.

Alternatively, after the forming of the first bonding electrode and the second bonding electrode, the method further includes:

a plurality of holes is formed on the first bonding electrode, the second bonding electrode, or the first bonding electrode and the second boding electrode.

Alternatively, the plurality of holes in bonding electrodes are divided into a first group and the second group, where holes of the first group and holes of the second group are formed symmetrically about a connecting line from the first through hole to the second through hole.

Compared with the prior art, the technical solutions provided by the disclosure at least have the following advantages:

The disclosure provides a mini LED chip and a manufacturing method thereof, including: a growth substrate and a light-emitting epitaxial layer sequentially stacked, the light-emitting epitaxial layer includes a first type semiconductor layer, a luminous layer and a second type semiconductor layer which are sequentially stacked, where the second type semiconductor layer and the luminous layer are provided with an electrode contact hollow part that exposes the first type semiconductor layer; a transparent conductive layer, positioned on a side of the second type semiconductor layer facing away from the growth substrate, and the transparent conductive layer includes a hollow part that is corresponding to the electrode contact hollow part; the extended electrode, disposed on a side of the transparent conductive layer that is facing away from the growth substrate; an insulating and isolating reflection layer, configured to cover the electrode contact hollow part and the exposed surface of the transparent conductive layer and the extended electrode facing away from the growth substrate, where the insulating isolation reflection layer includes a first through hole exposing the first type semiconductor layer corresponding to the electrode contact hollow part and a second through hole exposing the extended electrode corresponding to the extended electrode; and a first bonding electrode and a second bonding electrode, disposed on a side of the insulating and isolating reflection layer and facing away from the growth substrate, where the first bonding electrode contacts the first type semiconductor layer via the first through hole, and the second bonding electrode contacts the extended electrode via the second through hole.

Examples of the present disclosure improve the luminous efficacy and reliability of the mini LED chip, and ensure that the luminous angle of the mini LED chip achieves the expected effect simultaneously.

Specifically, according to the examples provided by the present disclosure, the first type semiconductor layer and the first bonding electrode are not connected through the corresponding auxiliary extension electrode, that is, no auxiliary extended electrode is formed on the exposed surface of the first type semiconductor layer at the electrode contact hollow part. So that the problem that the auxiliary extended electrode blocks the area of the luminous area is avoided, and the luminous efficacy of the mini LED chip is improved. Furthermore, there is no need to manufacture the auxiliary extension electrode in present disclosure, so that the problems of poor flatness of the first bonding electrode and poor coverage effect of the insulating and isolating reflection layer due to the existence of auxiliary extended electrodes are solved. Then the reliability of the mini LED chip is improved. Meanwhile, the luminous angle of the mini LED chip is ensured to achieve the expected effect.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A mini light-emitting diode (LED) chip, comprising:
a growth substrate and a light-emitting epitaxial layer sequentially stacked, wherein the light-emitting epitaxial layer comprises a first type semiconductor layer, a luminous layer, and a second type semiconductor layer which are sequentially stacked, wherein the second type semiconductor layer and the luminous layer comprise an electrode contact hollow part that exposes the first type semiconductor layer;
a transparent conductive layer, disposed on a side of the second type semiconductor layer facing away from the growth substrate, wherein the transparent conductive layer comprises a hollow part corresponding to the electrode contact hollow part;
an extended electrode, disposed on a side of the transparent conductive layer facing away from the growth substrate;
an insulating and isolating reflection layer, configured to cover the electrode contact hollow part and an exposed surface of the transparent conductive layer and the extended electrode facing away from the growth substrate, wherein the insulating and isolation reflection layer comprises a first through hole exposing the first type semiconductor layer corresponding to the electrode contact hollow part and a second through hole exposing the extended electrode corresponding to the extended electrode; and
a first bonding electrode and a second bonding electrode, disposed on a side of the insulating and isolating reflection layer facing away from the growth substrate, wherein the first bonding electrode contacts the first type semiconductor layer via the first through hole, and the second bonding electrode contacts the extended electrode via the second through hole.

2. The mini LED chip according to claim 1, wherein at least one of the first and second bonding electrodes has a plurality of holes.

3. The mini LED chip according to claim 2, wherein the plurality of holes are divided into a first group and a second group;
holes in the first group and the second group are symmetrical about a connecting line from the first through hole to the second through hole.

4. The mini LED according to claim 2, wherein an aperture of the plurality of holes increases in a direction from the growth substrate to the light-emitting epitaxial layer.

5. The mini LED chip according to claim 2, wherein an aperture of the plurality of holes is in a range of 1 μm to 10 μm, including endpoint values.

6. The mini LED according to claim 2, wherein side walls of the plurality of holes are roughened surfaces.

7. The mini LED chip according to claim 6, wherein roughness Ra of the roughened surfaces is no greater than 50 μm.

8. The mini LED chip according to claim 1, wherein the insulating and isolating reflection layer further extends to cover a side exposed surface of the light-emitting epitaxial layer.

9. The mini LED chip according to claim 1, wherein the insulating and isolating reflection layer is a distributed Bragg reflector (DBR) insulating and isolating reflection layer.

10. The mini LED chip according to claim 9, wherein the DBR insulating and isolating reflection layer comprises a DBR reflection film layer structure formed by any combination of $SiO_2$, SiN, $TiO_2$, $Ta_2O_5$, or MgF.

11. The mini LED chip according to claim 1, wherein the electrode contact hollow part comprises an electrode contact hole located within the coverage area of the second type semiconductor layer and the luminous layer.

12. The mini LED chip according to claim 1, wherein a side wall of the first or the second through hole is roughened.

13. The mini LED chip according to claim 1, wherein an aperture of the first or the second though hole increases in a direction from the growth substrate to the light-emitting epitaxial layer.

14. The mini LED chip according to claim 1, wherein the extended electrode is made of a metal or an alloy, and a material of at least one of the first or the second bonding electrode comprises a metal or an alloy.

15. A method for manufacturing a mini light-emitting diode (LED) chip, comprising:
providing a growth substrate;
growing a light-emitting epitaxial layer on the growth substrate, wherein the light-emitting epitaxial layer comprises a first type semiconductor layer, a luminous layer and a second type semiconductor layer sequentially stacked, wherein the second type semiconductor layer and the luminous layer comprise an electrode contact hollow part that exposes the first type semiconductor layer;
forming a transparent conductive layer on a side of the second type semiconductor layer facing away from the growth substrate, wherein the transparent conductive layer comprises a hollow part corresponding to the electrode contact hollow part;
forming an extended electrode on a side of the transparent conductive layer facing away from the growth substrate;
forming an insulating and isolating reflection layer configured to cover the electrode contact hollow part and an exposed surface of the transparent conductive layer and the extended electrode facing away from the growth substrate, wherein the insulating and isolating reflection layer comprises a first through hole exposing the first type semiconductor layer corresponding to the electrode contact hollow part and a second through hole exposing the extended electrode corresponding to the extended electrode; and
forming a first bonding electrode and a second bonding electrode on a side of the insulating and isolating reflection layer facing away from the growth substrate, wherein the first bonding electrode contacts the first type semiconductor layer via the first through hole, and the second bonding electrode contacts the extended electrode via the second through hole.

16. The method according to claim 15, wherein forming the first and second through holes comprises:
etching the insulating and isolating reflecting layer corresponding to the first through hole and the second through hole by using a first etching gas, until the first type semiconductor layer is exposed at the first through hole and the extended electrode is exposed at the second through hole, wherein a boundary layer is formed on the insulating and isolating reflection layer corresponding to side walls of the first and the second through hole; and etching and removing the boundary layer by using a second etching gas.

17. The method according to claim 16, wherein the first etching gas comprises $CHF_3$, Ar, and $O_2$, or the first etching gas comprises $CF_4$, Ar, and $O_2$; and wherein the second etching gas comprises $BCl_3$, $Cl_2$, and Ar.

18. The method according to claim 15, wherein after forming of the first and the second bonding electrode, the method further comprises:

forming a plurality of holes on at least one of the first bonding electrode or the second bonding electrode.

19. The method according to claim 18, wherein the plurality of holes are divided into a first group and a second group, and holes of the first group and the second group are symmetrical about a connecting line from the first through hole to the second through hole.

20. A mini light-emitting diode (LED) chip, comprising:

a growth substrate and a light-emitting epitaxial layer sequentially stacked, wherein the light-emitting epitaxial layer comprises a first type semiconductor layer, a luminous layer, and a second type semiconductor layer which are sequentially stacked, wherein the second type semiconductor layer and the luminous layer comprise an electrode contact hollow part that exposes the first type semiconductor layer;

a transparent conductive layer, disposed on a side of the second type semiconductor layer facing away from the growth substrate, wherein the transparent conductive layer comprises a hollow part corresponding to the electrode contact hollow part;

an extended electrode, disposed on a side of the transparent conductive layer facing away from the growth substrate; and an insulating and isolating reflection layer, configured to cover the electrode contact hollow part and an exposed surface of the transparent conductive layer and the extended electrode facing away from the growth substrate, wherein the insulating and isolation reflection layer comprises a first through hole exposing the first type semiconductor layer corresponding to the electrode contact hollow part and a second through hole exposing the extended electrode corresponding to the extended electrode;

wherein a side wall of the first or the second through hole is roughened, or an aperture of the first or the second though hole increases in a direction from the growth substrate to the light-emitting epitaxial layer.

* * * * *